United States Patent
Mackin

(10) Patent No.: US 12,272,422 B2
(45) Date of Patent: Apr. 8, 2025

(54) COMPENSATION FOR CONDUCTANCE DRIFT IN ANALOG MEMORY IN CROSSBAR ARRAY

(71) Applicant: International Business Machines Corporation, Armonk, NY (US)

(72) Inventor: Charles Mackin, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 69 days.

(21) Appl. No.: 17/984,750

(22) Filed: Nov. 10, 2022

(65) Prior Publication Data

US 2024/0161792 A1    May 16, 2024

(51) Int. Cl.
  *G11C 11/00*  (2006.01)
  *G11C 7/10*  (2006.01)
  *G11C 11/54*  (2006.01)

(52) U.S. Cl.
  CPC .......... *G11C 7/1063* (2013.01); *G11C 7/1069* (2013.01); *G11C 11/54* (2013.01)

(58) Field of Classification Search
  CPC ...... G11C 7/1063; G11C 7/1069; G11C 11/54
  See application file for complete search history.

(56) References Cited

U.S. PATENT DOCUMENTS

| | | | |
|---|---|---|---|
| 6,601,051 B1 * | 7/2003 | Lo | H03H 21/0012 706/30 |
| 10,754,921 B2 | 8/2020 | Khaddam-Aljameh | |
| 10,885,979 B2 | 1/2021 | Tang et al. | |
| 11,113,597 B2 | 9/2021 | Martin | |
| 11,158,363 B2 | 10/2021 | Sforzin | |
| 11,170,853 B2 | 11/2021 | DasGupta et al. | |
| 11,183,238 B2 | 11/2021 | Burr | |
| 11,461,640 B2 | 10/2022 | Tsai et al. | |
| 2020/0327406 A1 | 10/2020 | Piveteau | |
| 2020/0334525 A1 | 10/2020 | Tsai et al. | |
| 2021/0209457 A1 | 7/2021 | Van Tran et al. | |
| 2021/0249073 A1 | 8/2021 | Grobis et al. | |

(Continued)

OTHER PUBLICATIONS

K. Spoon et al., "Accelerating Deep Neural Networks with Analog Memory Devices," 2020 IEEE International Memory Workshop (IMW), Dresden, Germany, 2020, pp. 1-4, doi: 10.1109/IMW48823. 2020.9108149. (Year: 2020).*

(Continued)

*Primary Examiner* — Pho M Luu
(74) *Attorney, Agent, or Firm* — Scully, Scott, Murphy & Presser, P.C.; Kimberly Zillig

(57) ABSTRACT

A system can compensate for activation drift in analog memory-based artificial neural networks. A set of input activation vectors can be input, at a first point in time, to a crossbar array. The first set of output activation vectors can be read from the output lines of the crossbar array. At a second point in time, which is a later time than the first point in time, the input set of activation vectors can be input to the crossbar array. A second set of output activation vectors can be read from the crossbar array. A function that maps the second set of output activation vectors to the first set of output activation vectors can be determined. The function can be applied to subsequent output activation vectors output by the crossbar array. A method thereof, can also be provided.

20 Claims, 6 Drawing Sheets

(56) References Cited

U.S. PATENT DOCUMENTS

| | | | |
|---|---|---|---|
| 2021/0264978 A1 | 8/2021 | Li | |
| 2021/0319300 A1* | 10/2021 | Joshi | G11C 13/004 |
| 2021/0397967 A1 | 12/2021 | Tsai | |
| 2022/0101142 A1 | 3/2022 | Tsai et al. | |
| 2022/0156569 A1* | 5/2022 | Shin | G06N 3/063 |
| 2023/0085867 A1* | 3/2023 | Rakin | G06N 3/063 |
| | | | 726/22 |
| 2023/0095606 A1* | 3/2023 | Su | G06V 10/82 |
| | | | 382/156 |
| 2023/0325659 A1* | 10/2023 | Solinas | G06N 3/08 |
| | | | 706/25 |

OTHER PUBLICATIONS

C. Mackin et al., "Neuromorphic Computing with Phase Change, Device Reliability, and Variability Challenges," 2020 IEEE International Reliability Physics Symposium (IRPS), Dallas, TX, USA, 2020, pp. 1-10, doi: 10.1109/IRPS45951.2020.9128315. (Year: 2020).*

Zhou, C., et al., "AnalogNets: ML-HW Co-Design of Noise-Robust TinyML Models and Always-On Analog Compute-In-Memory Accelerator", arXiv:2111.06503v1 [cs.AR], Nov. 10, 2021, 17 pages.

Zhou, Y., et al., "Bayesian Neural Network Enhancing Reliability Against Conductance Drift for Memristor Neural Networks", Science China Information Science, Jun. 2021, pp. 160408:1-160408:12, vol. 64.

Nandakumar, S.R., et al., "Mixed-Precision Deep Learning Based on Computational Memory", arXiv:2001.11773v1 [cs.ET], Jan. 31, 2020, 16 pages.

Mackin, C., et al., "Optimized Weight Programming for Analogue Memory-Based Deep Neural Networks", Research Square, Posted Nov. 10, 2021, 38 pages.

Le Gallo, M., et al., "Precision of Bit Slicing With In-Memory Computing Based on Analog Phase-Change Memory Crossbar", Neuromorph. Comput. Eng. (2022), Received Sep. 30, 2021, Revised Jan. 21, 2022, Accepted for Publication Jan. 27, 2022, Published Feb. 18, 2022, 15 pages, 2, 014009.

* cited by examiner

COMPENSATION FOR CONDUCTANCE DRIFT IN ANALOG MEMORY IN CROSSBAR ARRAY

BACKGROUND

The present application relates generally to analog memory-based artificial neural networks and more particularly to techniques that compensate for conductance drift in analog memory-based artificial neural networks.

Analogue memory-based neural network devices or accelerators may be developed using memories such as resistive RAM (ReRAM), conductive-bridging RAM (CBRAM), NOR flash, magnetic RAM (MRAM), and phase-change memory (PCM).

Resistive elements, however, may not stay stable over time. Rather those elements may degrade with time, changing their resistivity and conductivity. Outputs of computations performed using values stored on such resistive elements, therefore, can in turn also decay or change over time, thus compromising accuracy of the computation.

BRIEF SUMMARY

The summary of the disclosure is given to aid understanding of a system and method of compensating for conductance drift in analog memory-based artificial neural networks, and not with an intent to limit the disclosure or the invention. It should be understood that various aspects and features of the disclosure may advantageously be used separately in some instances, or in combination with other aspects and features of the disclosure in other instances. Accordingly, variations and modifications may be made to the system and/or their method of operation to achieve different effects.

A method, in an aspect, can include inputting, at a first point in time, a set of input activation vectors to a crossbar array. The crossbar array can include at least a plurality of input lines, a plurality of output lines, and at least one memory device at each cross point of the plurality of input lines and the plurality of output lines. The at least one memory device at each cross point can store a synaptic weight. The method can also include reading out a first set of output activation vectors at the plurality of output lines of the crossbar array. The first set of output activation vectors can represent outputs of operations performed on the crossbar array based on the set of input activation vectors input at the first point in time and the synaptic weight stored on the at least one memory device at each cross point. The method can also include inputting, at a second point in time, the input set of activation vectors to the crossbar array, the second point in time being a later time than the first point in time. The method can also include reading out a second set of output activation vectors at the plurality of output lines of the crossbar array. The second set of output activation vectors represent outputs of the operations performed on the crossbar array based on the set of input activation vectors input at the second point in time and the synaptic weight stored on the at least one memory device at each cross point. The method can also include determining a function that maps the second set of output activation vectors to the first set of output activation vectors. The method can also include applying the function to subsequent output activation vectors output by the crossbar array.

Advantageously, the method in an aspect can improve inference accuracy and/or minimize inference accuracy degradation, which may occur due to conductance drift in memory elements.

A system, in an aspect, can include at least one processor. The system can also include at least one crossbar array arranged with at least a plurality of input lines, a plurality of output lines, and at least one memory device at each cross point of the plurality of input lines and the plurality of output lines. The at least one memory device at each cross point can store a synaptic weight. The at least one processor can be configured to input, at a first point in time, a set of input activation vectors to the crossbar array. The at least one processor can also be configured to read a first set of output activation vectors from the plurality of output lines of the crossbar array, the first set of output activation vectors representing outputs of operations performed on the crossbar array based on the set of input activation vectors input at the first point in time and the synaptic weight stored on the at least one memory device at each cross point. The at least one processor can also be configured to input, at a second point in time, the input set of activation vectors to the crossbar array, the second point in time being a later time than the first point in time. The at least one processor can also be configured to read a second set of output activation vectors from the plurality of output lines of the crossbar array, the second set of output activation vectors representing outputs of the operations performed on the crossbar array based on the set of input activation vectors input at the second point in time and the synaptic weight stored on the at least one memory device at each cross point. The at least one processor can also be configured to determine a function that maps the second set of output activation vectors to the first set of output activation vectors. The at least one processor can also be configured to apply the function to subsequent output activation vectors output by the crossbar array.

Advantageously, the system in an aspect can improve inference accuracy and/or minimize inference accuracy degradation, which may occur due to conductance drift in memory elements.

Further features as well as the structure and operation of various embodiments are described in detail below with reference to the accompanying drawings. In the drawings, like reference numbers indicate identical or functionally similar elements.

DETAILED DESCRIPTION

Figure 1:
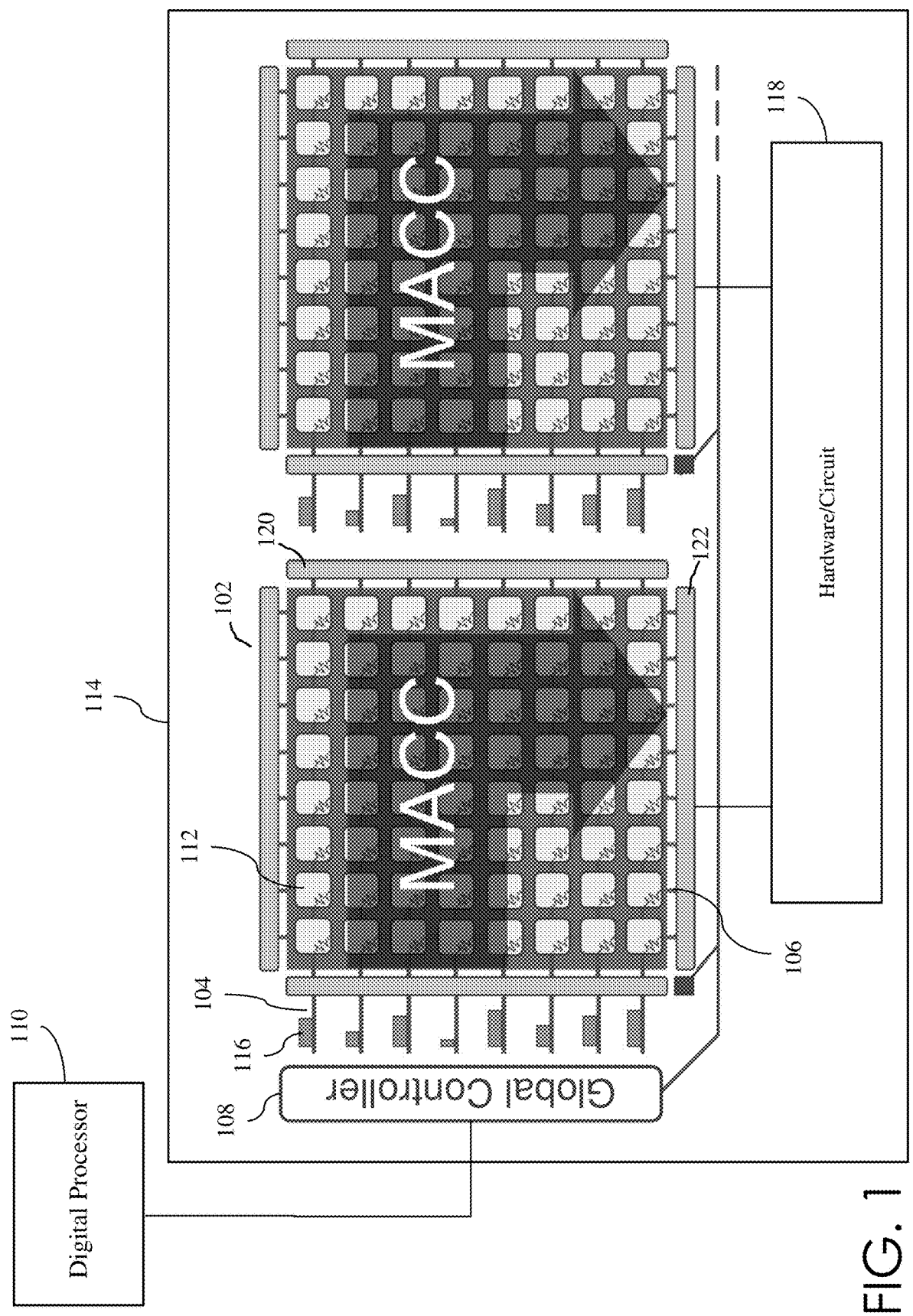
FIG. 1 is a diagram illustrating analog memory-based devices implementing a hardware neural network in an embodiment.

Analog memory-based neural network may utilize, by way of example, storage capability and physical properties of memory devices such as phase-change memory (PCM) devices to implement an artificial neural network. This type of in-memory computing hardware increases speed and energy efficiency, providing potential performance improvements. Rather than moving data from DRAM memory to a processor such as a CPU to perform a computation, analog neural network chips perform computation in the same place where the data is stored. Because there is no movement of data, tasks can be performed faster and require less energy.

PCM is a resistive non-volatile memory (NVM) device or memristive technology, which records data in a nanometric volume of phase-change material sandwiched between two electrodes. The phase-change material is in the low-resistive crystalline phase in an as-fabricated device. By applying a current pulse of sufficient amplitude (typically referred to as the RESET pulse) an amorphous region around the narrow bottom electrode is created via a melt-quench process. The device will be in a low conductance state if the high-resistive amorphous region blocks the current path between the two electrodes. The size of the amorphous region can be modulated in an almost completely analog manner by the application of suitable electrical pulses.

By way of example, with phase-change memory (PCM), an electrical pulse is applied to the material, changing the conductance of the device by switching the material between amorphous and crystalline phases. A low electrical pulse will make the PCM device more crystalline (less resistance). A high electrical pulse will make the device more amorphous (more resistance). The PCM device can record its state as a continuum of values, by way of example, between 0 and 1, another arbitrary range of values. This value can represent a synaptic weight used in neural network implementation. These weights (which can have negative and/or positive values) can be stored in the physical atomic configuration of each PCM in a non-volatile way (the weights are retained when the power supply is turned off).

Computational memories based on crossbar arrays using electronic devices including resistive NVM devices such as PCM devices can be used for ANN computations, for example, for training a deep neural network (DNN) and/or as inference accelerators for inferences with such networks. For instance, in deep learning or neural network inference, data propagation through multiple layers of a neural network involves a sequence of matrix multiplications. Each layer can be represented as a matrix of synaptic weights. These weights can be stored in the conductance states of PCM devices. These PCM devices can be arranged in crossbar arrays, creating an artificial neural network where all matrix multiplications are performed in-place in an analog manner. For example, the arrays on the chip can directly relate to the synapse layers of the neural network.

For example, a multiply accumulate (MAC) device can include PCM devices arranged in a crossbar configuration, e.g., as a crossbar array, and can perform an analog matrix-vector multiplication in a single time step. Such MAC devices can be used to implement hardware or analog memory-based neural network.

PCM devices may exhibit temporal variations or drifts in their conductance values, which may lead to errors over time in the computations such as neural network computations performed on or using such devices. Ability to correct such variations in the conductance values can improve neural network devices, e.g., co-processors, DNN inference devices such as accelerators.

In one or more embodiments, a system and/or method can compensate for conductance drift (e.g., temporally varying conductance values) in a device, through the use of a time-dependent scalar and offset, for example, at the output of a device, e.g., at the output of each multiply-accumulate (MAC) tile or hardware. In an embodiment, drift compensation (or correcting for temporally varying conductance) can be performed for each activation. Activation or activation vector refers to signals propagating through a neural network. Allowing for a time-dependent scalar and offset can provide for conductance drift to be compensated for more effectively. This improves inference accuracy and/or minimizes inference accuracy degradation, which may occur due to conductance drift.

While the methodology of correcting conductance drift is described herein, by way of example, in relation to a PCM device, the methodology can be applicable to other neural network hardware devices, such as those that may use and exhibit properties of conductance drift over time. Examples of such devices include, but are not limited to, memristive devices, such as phase-change memory (PCM) devices described above, resistive random-access memory (RRAM or ReRAM) devices, static random-access memory (SRAM) devices, conductive-bridging RAM (CBRAM), NOR (not-or gate) flash, magnetic RAM (MRAM).

Conductance in some of those devices may drift over time in analog memory-based deep neural network (DNN) processors or accelerators, for example, implemented using memristive or resistive NVM devices as those described above. Such drifts cause weights to decay or change with time, which also cause the resulting activations of neural network to decay or change over time. Activation decays can introduce errors in DNN computations and result in degraded inference accuracy.

Drift compensation works by "boosting" and/or "reducing" activations close to their original levels using some multiplicative factor and offset, which may be time varying. In one or more embodiments, the system and/or method can modify affine scales and biases for drift compensation. The drift compensation method in some embodiments introduces a scalar and offset to the output activations. Including an offset can be useful particularly when conductance, and therefore weights, exhibit complex conductance-dependent drift characteristics. The scalar and offset used in compensations may be time varying. The system and/or method can provide for added flexibility during drift compensation and improve inference accuracy over time. Such scalar and offset can be implemented, for example, for analog multiply accumulate (MAC) hardware.

FIG. 1 is a diagram illustrating analog memory-based devices implementing a hardware neural network in an embodiment. In a system that includes such analog memory-based devices, e.g., as a co-processor or accelerator, one or more digital processors 110 can communicate with the co-processor in performing its operations or functions for various applications.

In an embodiment, such device can be a co-processor 114 or accelerator including multiply accumulate (MAC) hardware having a crossbar structure or array, e.g., shown at 102. While the figure shows a pair of MAC hardware, there can be many of those tiles (one MAC tile is shown at 102) integrated on a coprocessor 114. By way of example, an analog multiply accumulate device 102 includes electronic devices including memory elements 112, which are arranged at cross points of the crossbar array. For example, at each cross point or junction of the crossbar structure or crossbar array, there can be at least one electronic device 112 including a resistive memory or memristive element such as a PCM element or device. In an embodiment, such resistive memory element can be programmed to store synaptic weights of an artificial neural network (ANN). Each MAC tile or array 102 can represent a layer of an ANN. For example, a co-processor may include, at each crossing point, one of the resistive memory elements 112 connecting a respective one of the input lines 104 with a respective one of the output lines 106. The array 102 may be a regular array with a constant distance between its crossing points in a horizontal and vertical dimension on the surface of a substrate. Each MAC tile can perform vector-matrix multiplication. By way of example, a MAC tile or array 102 can include peripheral circuitry such as pulse width modulators at 120 and peripheral circuitry such as analog-to-digital converters (ADCs) 122.

By way of example, the co-processor (e.g., including PCM devices) 114 can be interfaced to a hardware including another processor such as a field programmable gate array (FPGA) board, e.g., 110 There can also be digital-to-analog converters, which can provide the power supplies, the voltage and current to the co-processor. The FPGA board 110 can implement digital logic to interface with the co-processor and the electronics of the digital-to-analog converters.

Electrical pulses 116 or voltage signals can be input (or applied) to input lines 104 of the crossbar structure 102. Output currents can be obtained from output lines 106 of the crossbar structure, for example, according to a multiply-accumulate operation, based on the input pulses or voltage signals applied to input lines and the values (synaptic weights) stored on the resistive memory elements.

To compensate for drift in conductance occurring in the resistive memory elements (e.g., PCM devices), the system in an embodiment incorporates a scalar and offset to the output current or signals (e.g., output at the output lines 106) of the neural network hardware. Including offset in drift compensation can reduce activation errors, e.g., mean square error (MSE), for example, particularly in analog memories with complex conductance-dependent drift characteristics.

Drift compensation in a multiply accumulate (MAC) device can be expressed as:

$$z_j(t) = \alpha_j(t)[\Sigma \tilde{W}_{ij}(t)x_i] + b_j + \beta_j(t),$$

where, $z_j(t)$ is the per column activation, $\Sigma \tilde{W}_{ij}(t)x_j$ is the raw or uncompensated output value of the neural network implemented by MAC, (e.g., where the summation applies to all i's or all rows, e.g., per column j), $b_j$ is the bias term (a parameter) of the neural network implement by MAC, $\alpha_j(t)$ is the per-column time-dependent affine scale drift compensation, $\beta_j(t)$ is the per-column time-dependent bias drift compensation, i represents a row, j represents a column.

Determining the scalar and offset can include finding a function that maps the output activation at some reference time (or t=0) and the output activation at a later time, for example, fitting a polynomial function, for example, polyfit (y_ref, y_t, order). For instance, in an embodiment, y_ref can be activations at time zero (t=0) or at some reference time; y_t can be activations at time t, where time t is later than time zero (or the reference time). Order represents the polynomial order. For example, order of 1 represents a linear function. Second order represents a quadratic function.

To determine the scalar and offset values, in some embodiments, electric pulses or voltage signals can be input or applied to input lines of a crossbar array implementing an artificial neural network, at a point in time (e.g., first point in time). The electric pulses or voltage signals represent an input set of activations vectors, for example, which can be operated on with synaptic weights stored on the crossbar array. The crossbar array outputs a set of output activation signals corresponding to the input, for example, according to multiply accumulate operations performed on the crossbar array. The multiply-accumulate operation causes the signals coupled into the input lines to be respectively multiplied by values stored on the devices at the cross points or junctions. The set of output activation signals can be read and represent a first set of output activation vectors. At a later point in time, the same input (e.g., identical electric pulses or voltage signals applied to the input lines at the first point in time) can be applied to the input lines of the crossbar array. Again, the crossbar array outputs a set of output activation signals corresponding to the input, for example, according to multiply accumulate operations performed on the crossbar array. The second set of output activation signals can be read and represent a second set of output activation vectors. Using the first set of output activation signals and the second set of output activation signals, a processor (e.g., 110) or another hardware circuit (e.g., 118) finds at least one function that maps the second set of output activation vectors to the first set of activations signals. The function can then be applied to subsequent output activations of the crossbar array, to compensate for conductance drift exhibited in the memory or memristive elements or devices 112 of the crossbar array. For example, the processor 110 or another hardware circuit 118 can apply the function to subsequent output activations of the crossbar array.

For example, a crossbar array structure can include N input lines 104 and M output lines 106. A controller 108 can program the resistive memory elements or devices (e.g., PCM devices) 112, to store synaptic weights values of an artificial neural network, for example, to have electrical conductance (or resistance) representative of such values. The controller 108 can include (or can be connected to) a signal generator (not shown) to couple input signals (e.g., to apply pulse durations or voltage biases) into the input lines 104 or directly into the outputs.

In an embodiment, one or more readout circuits (e.g., at 122) can be connected or coupled to read out the M output signals (electrical currents) obtained from the M output lines 106. For example, a readout circuit may read currents as directly outputted from the crossbar array, which can be fed to another hardware or circuit 118, that performs the compensation. A second readout circuit can also be incorporated to read the compensated values. In another embodiment, the compensation can be performed by another processor (e.g., 110) that receives the output values outputted at the output lines 106.

For example, a system for compensating for activation drift in analog memory-based artificial neural networks can include at least one processor 110. The system can include at least one crossbar array 102 arranged with at least a plurality of input lines 104, a plurality of output lines 106, and at least one memory device at each cross point of the plurality of input lines and the plurality of output lines 112. The memory device 112 at each cross point can store a synaptic weight of an artificial neural network. At least one memory device 112 at each cross point includes an analog non-volatile memory device. There can be more than one memory device 112 for representing one weight value.

The processor (e.g., 110) can be configured to input (e.g., via the controller 108), at a first point in time, a set of input activation vectors into the crossbar array. In one embodiment, the set of input activation vectors, which is input into the crossbar array, is encoded as electrical pulse durations. In another embodiment, the set of input activation vectors, which is input into the crossbar array, is encoded as voltage signals.

The processor can also be configured to read a first set of output activation vectors from the plurality of output lines 106 of the crossbar array. The first set of output activation vectors represent outputs of operations performed on the crossbar array based on the set of input activation vectors input at the first point in time and the synaptic weight stored on the at least one memory device at each cross point. The operations include multiply-accumulate operations. For example, input activation vectors get multiplied by the value (e.g., synaptic weight) stored on the at least one memory device of the crossbar array, and accumulated (added) column-wise. Output activation vectors result in each one of those columns (output lines).

The processor (e.g., 110) can also be configured to input, at a second point in time, the input set of activation vectors into the crossbar array. The second point in time is a later time than the first point in time.

The processor (e.g., 110) can also be configured to read a second set of output activation vectors from the plurality of output lines (e.g., 106) of the crossbar array. The second set of output activation vectors represent outputs of the operations performed on the crossbar array based on the set of input activation vectors input at the second point in time and the synaptic weight stored on at least one memory device at each cross point.

In an embodiment, the processor (e.g., 110) can also be configured to determine a function that maps the second set of output activation vectors to the first set of output activation vectors. In another embodiment, a dedicated digital circuitry can be implemented specifically for calculating the time-varying scales and offsets.

The processor (e.g., 110) can also be configured to apply the function to subsequent output activation vectors output by the crossbar array. For example, the function can be applied to each one of the output columns that varies as function of time.

In an embodiment, a scalar ($\alpha_j(t)$) and offset ($\beta_j(t)$) can be determined for every column (e.g., j), i.e., per activation. For example: $\beta_j(t)$, $\alpha_j(t)$=polyfit($a_j(t=0)$, $a_j(t)$, order=1).

In another embodiment, the scalar ($\alpha_j(t)$) and offset ($\beta_j(t)$) can be determined globally, i.e., the same $\alpha_j(t)$ and the same $\beta_j(t)$ across all columns.

Figure 3:
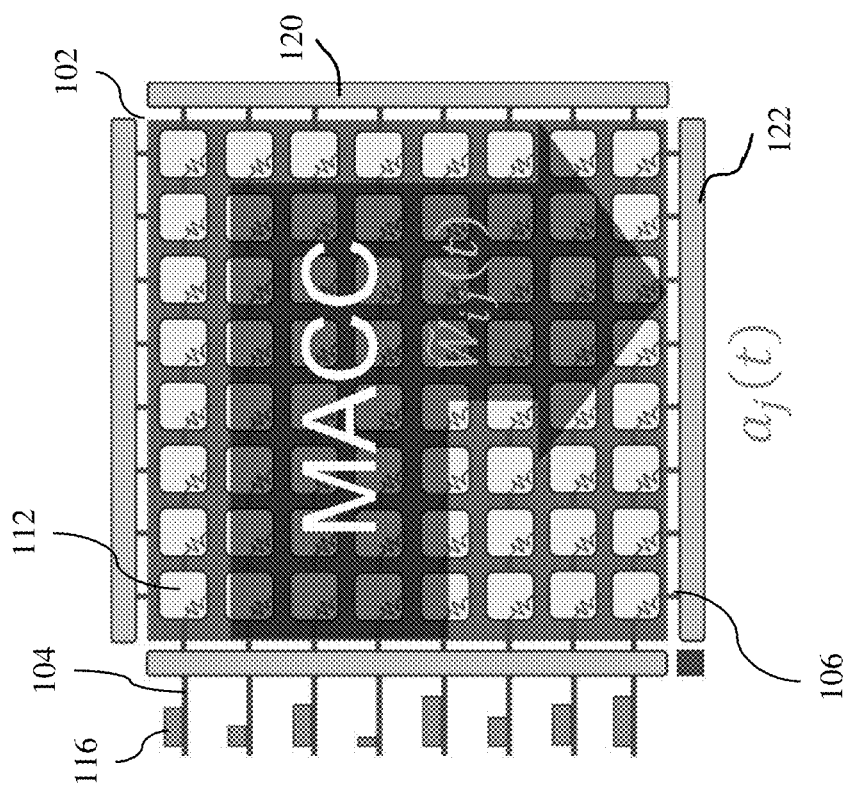
FIG. 3 shows a diagram of a crossbar array in an embodiment, where drift compensation values can be determined and applied with respect to the weight values.

Yet in another embodiment, drift compensation can be calculated by measuring the synaptic weights. For example: $\beta_j(t)$, $\alpha_j(t)$=polyfit($\tilde{W}_j(t=0)$, $\tilde{W}_j(t)$, order=1), where $\tilde{W}_j$ represent synaptic weight values stored at column j of the crossbar array. By way of example, FIG. 3 shows a diagram of a crossbar array in an embodiment, where drift compensation values can be determined with respect to the weight values, and applied to the output activations. $a_j(t)$ shown represents activation vector per j-th column at time t. $\tilde{W}_{ij}(t)$ represents synaptic weight values stored at row i, column j of the crossbar array. For instance, synaptic weight values stored on the memory devices (e.g., 112) can be read out at a first point in time and at a second point in time (which is a later time than the first point in time). A processor 110 or another on-chip hardware circuit (e.g., 118) can find or determine a function that maps the weight values read at the second point in time to the weight values read at the first point in time. Then the drift in the weight values at the memory devices (e.g., 112) can be compensated by applying the function to the output activations. In an embodiment, one same function (e.g., scalar and offset) can be determined for all synaptic weights of the array, e.g., all memory elements. In another embodiment, different functions can be determined for different ones or sets of memory elements (weight values stored in those memory elements). For example, compensation can be customized for each memory element, or group of memory elements.

Including scalar and offset values for drift compensation improves inference accuracy. In an embodiment affine scales and biases can be modified. The method can work for different drift models. In an embodiment, the calculation can be simple as a least square fitting (e.g., finding the best-fitting curve to a given set of points by minimizing the sum of the squares of the offsets ("the residuals") of the points from the curve), which saves time steps, in computing the scalar and offset. For example, the scalar and offset provide relations between the first set and the second set of output activation vectors.

In an embodiment, a dedicated hardware or circuit (e.g., 118 or at 122) can be coupled to the MAC to compute the scalar and offset. For example, a dedicated hardware may be directly connected to the crossbar array, receive the output activation signals, and perform the compensation, e.g., as described above, by determining a function. A readout circuit may read currents as compensated for conductance variations.

Figure 2:
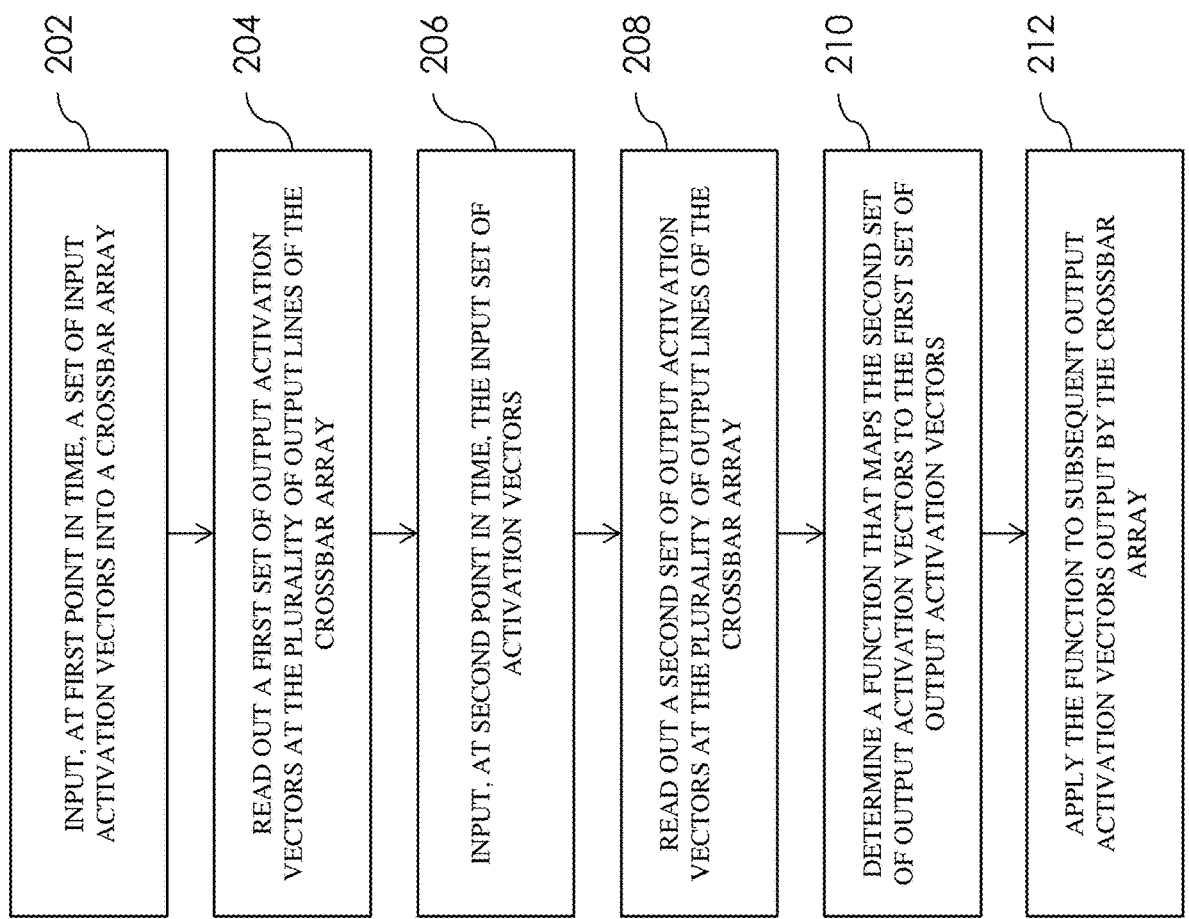
FIG. 2 is a flow diagram illustrating a method of compensating activation drift in artificial neural network device, in an embodiment.

In another embodiment, the computation may be done off-chip, for example, on a separate computer or another processor (e.g., 110), then the scalar and offset values can be fed into the chip. For example, a readout circuit may read currents as directly outputted from the crossbar array. The output can be sent to an off-chip processor, such as a laptop or another processing device, to determine the function described above. Such a processor may communicate the determined function to the controller. The controller 108 may then apply the function to the output activation signals to perform the compensation. Experiments show that including offset term enables more effective drift compensation FIG. 2 is a flow diagram illustrating a method of compensating activation drift in artificial neural network device, in an embodiment. The method can be performed by one or more processors, which can be coupled to a crossbar array or another processor or co-processor implementing a crossbar structure for operations such as a multiply accumulate (MAC or MACC) operations, for example, as described with reference to FIG. 1.

At 202, the method can include inputting, at a first point in time, a set of input activation vectors into a crossbar array. The crossbar array includes or arranged to be structured with at least a plurality of input lines, a plurality of output lines, and at least one memory device at each cross point of the plurality of input lines and the plurality of output lines. At least one memory device at each cross point can store a synaptic weight, e.g., implemented in, or associated with, a neural network. In an embodiment, at least one memory device at each cross point includes an analog non-volatile memory device.

In an embodiment, the set of input activation vectors, which is input into the crossbar array, is encoded as electrical pulse durations. In another embodiment, the set of input activation vectors, which is input into the crossbar array, is encoded as voltage signals.

In an embodiment, the set of input activation vectors are sampled from a machine learning training dataset. In another embodiment, the set of input activation vectors are sampled from a machine learning test dataset. Yet in another embodiment, the set of input activation vectors are sampled from a distribution such as normal or uniform distribution. Distribution can also be based on the weights within a MAC tile and specific activations likely to be encountered during inference.

At 204, the method can include reading out a first set of output activation vectors at the plurality of output lines of the crossbar array. The first set of output activation vectors represent outputs of operations performed on the crossbar array based on the set of input activation vectors input at the first point in time and the synaptic weight stored on the at least one memory device at each cross point. In an embodiment, the operations include multiply-accumulate operations.

At 206, the method can include inputting, at a second point in time, the input set of activation vectors to the crossbar array. The second point in time is a later time than the first point in time. The time difference or lapse between the first point in time and the second point in time can vary. For example, the time difference can be very short (e.g., in nanoseconds) for high-speed applications that require high inference accuracy. As another example, the time difference can be larger or longer, and can depend on how frequently the weights are reprogrammed or retuned.

At 208, the method can include reading out a second set of output activation vectors at the plurality of output lines of the crossbar array. The second set of output activation vectors represent outputs of the operations performed on the crossbar array based on the set of input activation vectors input at the second point in time and the synaptic weight stored on the at least one memory device at each cross point.

At 210, the method can include determining a function that maps the second set of output activation vectors to the first set of output activation vectors. In an embodiment, the function includes a first-order polynomial least square fit between the first set of output activation vectors and the second set of output activation vectors. For example, in an embodiment, determining a function that maps the second set of output activation vectors to the first set of output activation vectors, can include determining a first-order polynomial least square fit for each column of the crossbar array.

In another embodiment, the function includes an n-th order polynomial least square fit between the first set of output activation vectors and the second set of output activation vectors, where n is an integer greater than 1. For example, in an embodiment, determining a function that maps the second set of output activation vectors to the first set of output activation vectors, can include determining an n-th order polynomial least square fit for each column of the crossbar array, wherein n is an integer greater than 1.

Yet in another embodiment, the function includes an n-th order polynomial L1 norm fit between the first set of output activation vectors and the second set of output activation vectors, where n is an integer greater than 1. For example, in an embodiment, determining a function that maps the second set of output activation vectors to the first set of output activation vectors, can include determining an n-th order polynomial L1 norm fit for each column of the crossbar array, where n is an integer greater than 1. Briefly, L1 norm minimizes the sum of the absolute value of the differences between the output activations; L2 norm minimizes the sum of the squared differences between the output activations at the different times.

Still yet in another embodiment, the function includes an n-th order polynomial norm fit between the first set of output activation vectors and the second set of output activation vectors, where n is an integer greater than 1. For example, in an embodiment, determining a function that maps the second set of output activation vectors to the first set of output activation vectors, can include determining an n-th order polynomial norm fit for each column of the crossbar array, where n is an integer greater than 1.

In one or more of the above described embodiments, the first order polynomial fit finds or determines a scalar (e.g., a slope) and an offset (or also referred to as a bias), which maps the second set of output activation vectors to the first set of output activation vectors. The first order polynomial fit can include any norm fit (e.g., L1, L2, and/or any other norm it). In one or more of the above described embodiments, the n-th order polynomial fit finds a plurality of parameters and an offset, which maps the second set of output activation vectors to the first set of output activation vectors. In one or more embodiment, n (in n-th order polynomial fit) can be an integer greater than or equal to zero. For example, where n=0, the beta term can also be a zero value.

At 212, the method can include applying the function to subsequent output activation vectors output by the crossbar array. For instance, considering the first order polynomial fit, a scalar (described above as alpha_sub_j ($\alpha_j$)) and an offset (described above as beta_sub_j ($\beta_j$)) can be applied to outputs of the crossbar array. In an embodiment different scalar and offset values can be determined for each j or column, where those different scalar and offset values are applied to subsequent outputs at the respective different j's or columns. For example, compensation can be customized for every column (or output line). In another embodiment, the same compensation can be performed for all columns (or output lines) of the crossbar array. For instance, compensation parameters can be computed (e.g., function determined) on one column (or output line), and those parameters (e.g., function) can be applied to all other columns.

In an embodiment, the method can be repeated periodically to find an updated function for mapping the outputs corresponding to the reference time (e.g., t=0) to the current time. For example, in an embodiment, the output activations can be recorded periodically and moved to another processor, where compensation calculations can be performed (e.g., find a function that maps the later acquired output activations to those acquired at a reference time (e.g., desired values)). The results of the calculation (e.g., function, e.g., scalar and offset) can be used to modify or compensate on the crossbar array, the future output activations generated or computed on the crossbar array.

Figure 4:
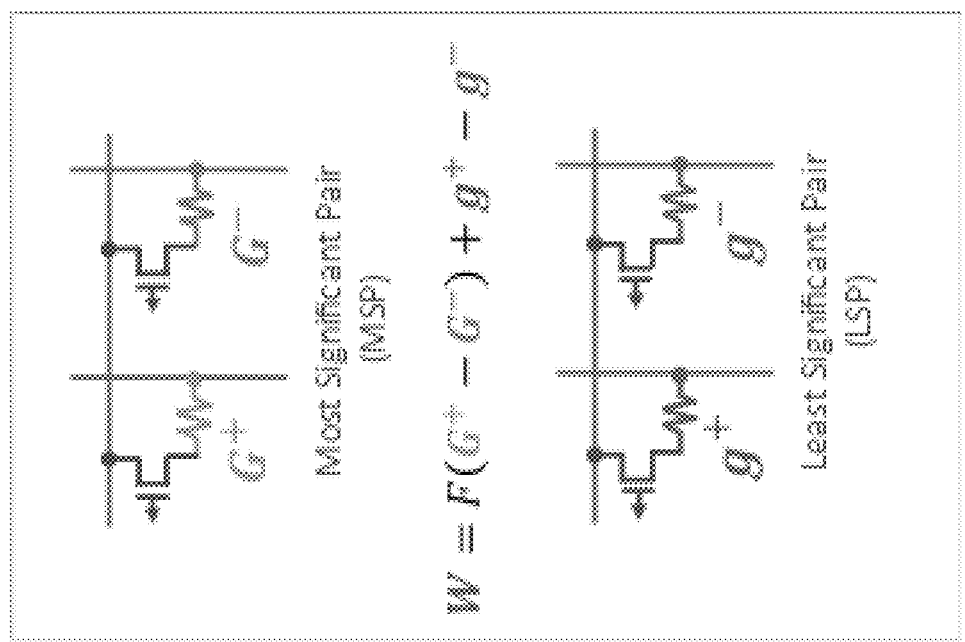
FIG. 4 shows a plurality of resistive memory elements that can be programmed to represent one weight value for a cross point of a crossbar array.

There can be more than one resistive memory element at a cross point of the crossbar array to represent a synaptic weight. For instance, weights can be constructed using different numbers of conductance (memory elements). For example, using additional resistive memory elements to represent one weight value can provide for more refined or precise value. By way of example, FIG. 4 shows four resistive memory elements that can be programmed to represent one weight value for a cross point (e.g., where multiplication is performed with the input value).

For example:
Conductance drift can be expressed as:

$$G(t) = G_0 \left(\frac{t}{t_0}\right)^{-\nu};$$

Weight of a neural network can be expressed as:

$$W = F(G^+ - G^-) + g^+ - g^-,$$

where $$G^+(t) = G_0^+ \left(\frac{t}{t_0}\right)^{-\nu_1},$$

$$G^-(t) = G_0^- \left(\frac{t}{t_0}\right)^{-\nu_2},$$

$$g^+(t) = g_0^+ \left(\frac{t}{t_0}\right)^{-\nu_3},$$

$$g^-(t) = g_0^- \left(\frac{t}{t_0}\right)^{-\nu_4},$$

where G is conductance, v (\nu) is drift coefficient, and t is time (e.g., time step). Drift coefficient v (\nu) can be a distribution that also has dependence on $G_0$. F is most significant conductance pair (MSP)/least significant conductance pair (LSP) scale factor. For example, the MSP pair can be used for course programming of the weights, and LSP pair can be used to fine tune the weights, for example, for providing higher resolution of a weight value. For instance, F can be used to increase the overall range of weight, and smaller g values can be used to fine tune the weight value. Using multiple resistive memory elements at a cross point where an operation is performed, can also provide for redundancy built into the crossbar array, e.g., where in case of a defective memory device is detected, another can be used as a backup.

Figure 5B:
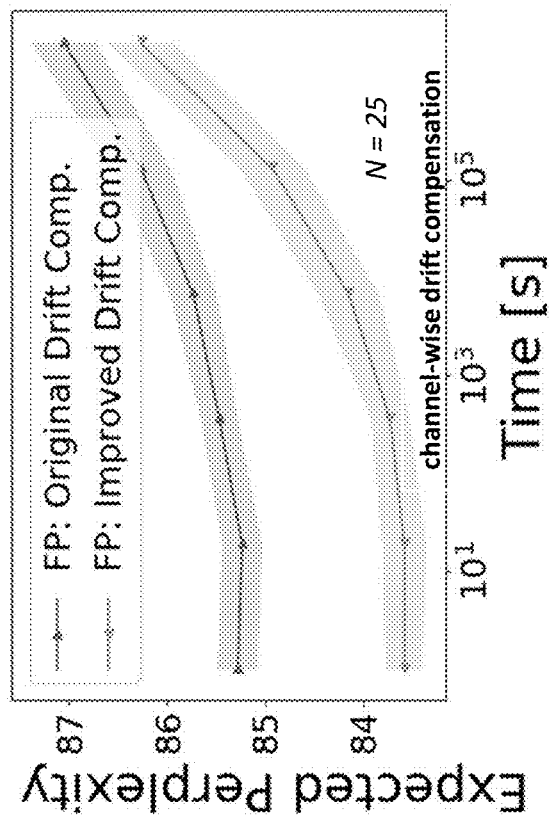
FIGS. 5A, 5B, 5C and 5D show examples of improvements to performance accuracy of neural networks provided by compensating conductance drift according to one or more embodiments.
Figure 5A:
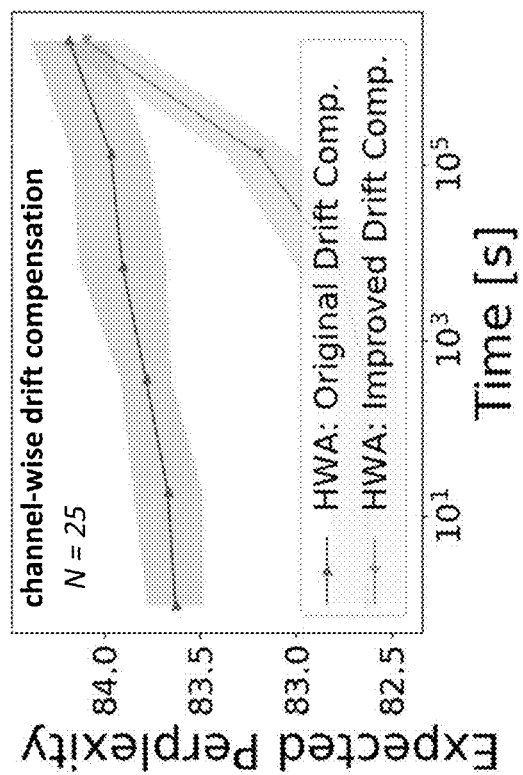
Figure 5D:
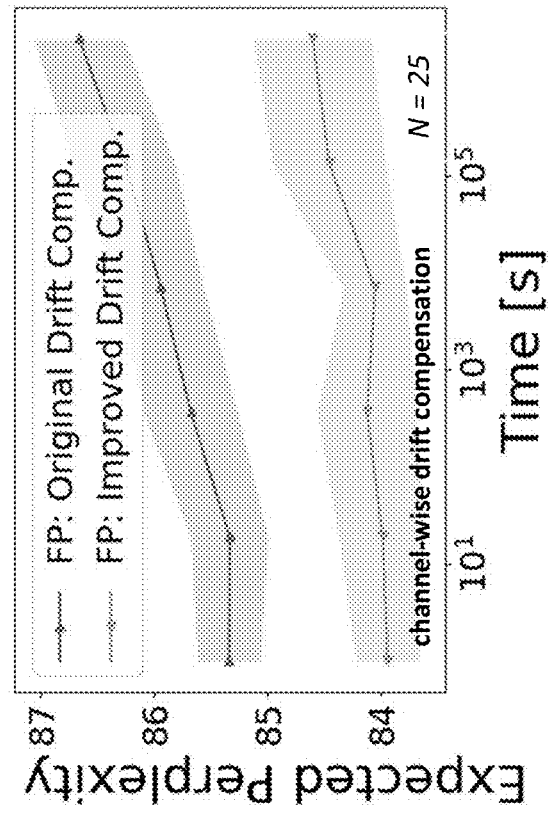
Figure 5C:
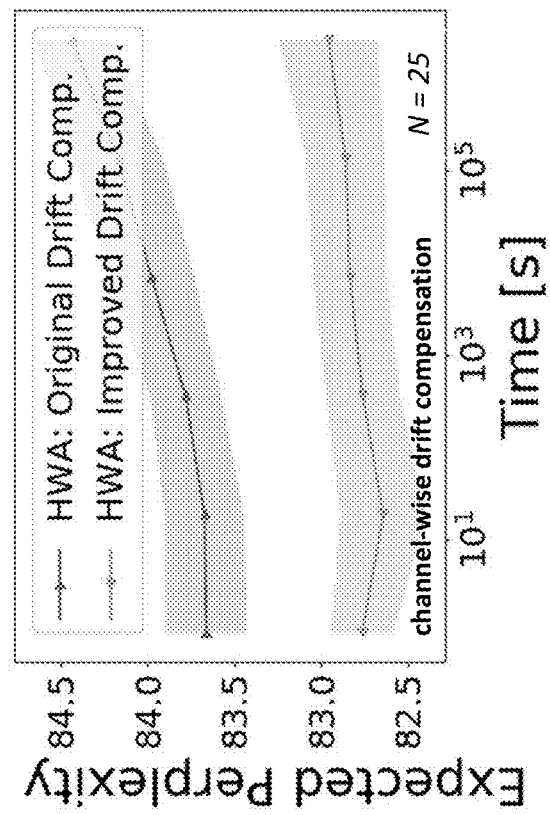

FIGS. 5A, 5B, 5C and 5D show examples of improvements to performance accuracy of neural networks provided by compensating drift conductance according to one or more embodiment. In various examples, synaptic weights of a neural network can be implemented using memory elements with different conductance properties whose conductance can drift at different rates, and also in complex distribution. For example, some devices decay faster than others. The system and method of compensating for those conductance drifts in one or more embodiments can work for different devices with different drift characteristics. Incorporating an offset (bias) in addition to a scalar factor can be useful in compensation methods where there are such complex drift characteristics. FIGS. 5A, 5B show performance improvements in long short term memory (LSTM) neural network implemented with devices having one type of drift model or characteristic. FIGS. 5C, 5D show performance improvements in long short-term memory (LSTM) neural network implemented with devices having another type of drift model or characteristic. As shown, inference accuracy improves in both hardware-aware (HWA) trained and floating point (FP) trained cases. Including an offset term enables more effective drift compensation. In the figures, lower perplexity denotes more accurate output.

Various aspects of the present disclosure are described by narrative text, flowcharts, block diagrams of computer systems and/or block diagrams of the machine logic included in computer program product (CPP) embodiments. With respect to any flowcharts, depending upon the technology involved, the operations can be performed in a different order than what is shown in a given flowchart. For example, again depending upon the technology involved, two operations shown in successive flowchart blocks may be performed in reverse order, as a single integrated step, concurrently, or in a manner at least partially overlapping in time.

A computer program product embodiment ("CPP embodiment" or "CPP") is a term used in the present disclosure to describe any set of one, or more, storage media (also called "mediums") collectively included in a set of one, or more, storage devices that collectively include machine readable code corresponding to instructions and/or data for performing computer operations specified in a given CPP claim. A "storage device" is any tangible device that can retain and store instructions for use by a computer processor. Without limitation, the computer readable storage medium may be an electronic storage medium, a magnetic storage medium, an optical storage medium, an electromagnetic storage medium, a semiconductor storage medium, a mechanical storage medium, or any suitable combination of the foregoing. Some known types of storage devices that include these mediums include: diskette, hard disk, random access memory (RAM), read-only memory (ROM), erasable programmable read-only memory (EPROM or Flash memory), static random access memory (SRAM), compact disc read-only memory (CD-ROM), digital versatile disk (DVD), memory stick, floppy disk, mechanically encoded device (such as punch cards or pits/lands formed in a major surface of a disc) or any suitable combination of the foregoing. A computer readable storage medium, as that term is used in the present disclosure, is not to be construed as storage in the form of transitory signals per se, such as radio waves or other freely propagating electromagnetic waves, electromagnetic waves propagating through a waveguide, light pulses passing through a fiber optic cable, electrical signals communicated through a wire, and/or other transmission media. As will be understood by those of skill in the art, data is typically moved at some occasional points in time during normal operations of a storage device, such as during access, de-fragmentation or garbage collection, but this does not render the storage device as transitory because the data is not transitory while it is stored.

The terminology used herein is for the purpose of describing particular embodiments only and is not intended to be limiting of the invention. As used herein, the singular forms "a", "an" and "the" are intended to include the plural forms as well, unless the context clearly indicates otherwise. As used herein, the term "or" is an inclusive operator and can mean "and/or", unless the context explicitly or clearly indicates otherwise. It will be further understood that the terms "comprise", "comprises", "comprising", "include", "includes", "including", and/or "having," when used herein, can specify the presence of stated features, integers, steps, operations, elements, and/or components, but do not preclude the presence or addition of one or more other features, integers, steps, operations, elements, components, and/or groups thereof. As used herein, the phrase "in an embodiment" does not necessarily refer to the same embodiment, although it may. As used herein, the phrase "in one embodiment" does not necessarily refer to the same embodiment, although it may. As used herein, the phrase "in another embodiment" does not necessarily refer to a different embodiment, although it may. Further, embodiments and/or components of embodiments can be freely combined with each other unless they are mutually exclusive.

As used herein, a "module" or "unit" may include hardware (e.g., circuitry, such as an application specific integrated circuit), firmware and/or software executable by hardware (e.g., by a processor or microcontroller), and/or a combination thereof for carrying out the various operations disclosed herein. For example, a processor or hardware may include one or more integrated circuits configured to perform function mapping or polynomial fits based on reading currents outputted from one or more of the output lines of the crossbar array at different time points, and/or apply the function to subsequent outputs to correct or compensate for temporal conductance variations in the crossbar array. The same or another processor may include circuits configured to input activation vectors encoded as electric pulse durations and/or voltage signals across the input lines for the crossbar array to perform its operations.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method comprising:
    inputting, at a first point in time, a set of input activation vectors to a crossbar array, the crossbar array including at least a plurality of input lines, a plurality of output lines, and at least one memory device at each cross point of the plurality of input lines and the plurality of output lines, the at least one memory device at each cross point storing a synaptic weight;
    reading out a first set of output activation vectors at the plurality of output lines of the crossbar array, the first set of output activation vectors representing outputs of operations performed on the crossbar array based on the set of input activation vectors input at the first point in time and the synaptic weight stored on the at least one memory device at each cross point;
    inputting, at a second point in time, the input set of activation vectors to the crossbar array, the second point in time being a later time than the first point in time;
    reading out a second set of output activation vectors at the plurality of output lines of the crossbar array, the second set of output activation vectors representing outputs of the operations performed on the crossbar array based on the set of input activation vectors input at the second point in time and the synaptic weight stored on the at least one memory device at each cross point, wherein the set of input activation vectors applied to the input lines of the crossbar array and used by the crossbar array in computing the first set of output activation vectors, are used by the crossbar array in computing the second set of output activation vectors;
    determining a function that maps the second set of output activation vectors which has been read out, to the first set of output activation vectors which has been read out; and
    compensating conductance drift exhibited in the crossbar array by applying the function to subsequent output activation vectors output by the crossbar array.

2. The method of claim 1, wherein the operations include multiply-accumulate operations.

3. The method of claim 1, wherein the set of input activation vectors, which is input into the crossbar array, is encoded as electrical pulse durations.

4. The method of claim 1, wherein the set of input activation vectors, which is input into the crossbar array, is encoded as voltage signals.

5. The method of claim 1, wherein the at least one memory device at each cross point includes an analog non-volatile memory device.

6. The method of claim 1, wherein the set of input activation vectors are sampled from a machine learning training dataset.

7. The method of claim 1, wherein the function includes a first-order polynomial least square fit between the first set of output activation vectors and the second set of output activation vectors.

8. The method of claim 1, wherein the determining a function that maps the second set of output activation vectors to the first set of output activation vectors, includes determining a first-order polynomial least square fit for each column of the crossbar array.

9. The method of claim 1, wherein the function includes an n-th order polynomial least square fit between the first set of output activation vectors and the second set of output activation vectors, wherein n is an integer greater than 1.

10. The method of claim 1, wherein the determining a function that maps the second set of output activation vectors to the first set of output activation vectors, includes determining an n-th order polynomial least square fit for each column of the crossbar array, wherein n is an integer greater than 1.

11. The method of claim 1, wherein the function includes an n-th order polynomial L1 norm fit between the first set of output activation vectors and the second set of output activation vectors, wherein n is an integer greater than 1.

12. The method of claim 1, wherein the determining a function that maps the second set of output activation vectors to the first set of output activation vectors, includes determining an n-th order polynomial L1 norm fit for each column of the crossbar array, wherein n is an integer greater than 1.

13. The method of claim 1, wherein the function includes an n-th order polynomial norm fit between the first set of output activation vectors and the second set of output activation vectors, wherein n is an integer greater than 1.

14. The method of claim 1, wherein the determining a function that maps the second set of output activation vectors to the first set of output activation vectors, includes determining an n-th order polynomial norm fit for each column of the crossbar array, wherein n is an integer greater than 1.

15. The method of claim 1, wherein the function includes an n-th order polynomial norm fit between the first set of output activation vectors and the second set of output activation vectors, wherein n is an integer greater than or equal to zero.

16. A system comprising:
    at least one processor; and
    at least one crossbar array arranged with at least a plurality of input lines, a plurality of output lines, and at least one memory device at each cross point of the plurality of input lines and the plurality of output lines, the at least one memory device at each cross point storing a synaptic weight,
    the at least one processor configured to:
        input, at a first point in time, a set of input activation vectors to the crossbar array;
        read first set of output activation vectors from the plurality of output lines of the crossbar array, the first set of output activation vectors representing outputs of operations performed on the crossbar array based on the set of input activation vectors input at the first point in time and the synaptic weight stored on the at least one memory device at each cross point;

input, at a second point in time, the input set of activation vectors to the crossbar array, the second point in time being a later time than the first point in time;

read a second set of output activation vectors from the plurality of output lines of the crossbar array, the second set of output activation vectors representing outputs of the operations performed on the crossbar array based on the set of input activation vectors input at the second point in time and the synaptic weight stored on the at least one memory device at each cross point, wherein the set of input activation vectors applied to the input lines of the crossbar array and used by the crossbar array in computing the first set of output activation vectors, are used by the crossbar array in computing the second set of output activation vectors;

determine a function that maps the second set of output activation vectors which has been read out, to the first set of output activation vectors which has been read out; and compensating conductance drift exhibited in the crossbar array by apply the function to subsequent output activation vectors output by the crossbar array.

17. The system of claim 16, wherein the operations include multiply-accumulate operations.

18. The system of claim 16, wherein the set of input activation vectors, which is input into the crossbar array, is encoded as electrical pulse durations.

19. The system of claim 16, wherein the set of input activation vectors, which is input into the crossbar array, is encoded as voltage signals.

20. A computer program product comprising a computer readable storage medium having program instructions embodied therewith, the program instructions readable by a device to cause the device to:

input, at a first point in time, a set of input activation vectors to a crossbar array, the crossbar array including at least a plurality of input lines, a plurality of output lines, and at least one memory device at each cross point of the plurality of input lines and the plurality of output lines, the at least one memory device at each cross point storing a synaptic weight;

read first set of output activation vectors from the plurality of output lines of the crossbar array, the first set of output activation vectors representing outputs of operations performed on the crossbar array based on the set of input activation vectors input at the first point in time and the synaptic weight stored on the at least one memory device at each cross point;

input, at a second point in time, the input set of activation vectors to the crossbar array, the second point in time being a later time than the first point in time;

read a second set of output activation vectors from the plurality of output lines of the crossbar array, the second set of output activation vectors representing outputs of the operations performed on the crossbar array based on the set of input activation vectors input at the second point in time and the synaptic weight stored on the at least one memory device at each cross point, wherein the set of input activation vectors applied to the input lines of the crossbar array and used by the crossbar array in computing the first set of output activation vectors, are used by the crossbar array in computing the second set of output activation vectors;

determine a function that maps the second set of output activation vectors which has been read out, to the first set of output activation vectors which has been read out; and compensate conductance drift exhibited in the crossbar array by applying the function to subsequent output activation vectors output by the crossbar array.

* * * * *